United States Patent [19]
Kawanaka

[11] Patent Number: 5,973,364
[45] Date of Patent: Oct. 26, 1999

[54] MIS SEMICONDUCTOR DEVICE HAVING BODY-CONTACT REGION

[75] Inventor: Shigeru Kawanaka, Kawasaki, Japan

[73] Assignee: Kabushiki Kaisha Toshiba, Kawasaki, Japan

[21] Appl. No.: 09/156,899

[22] Filed: Sep. 18, 1998

[30] Foreign Application Priority Data

Sep. 19, 1997 [JP] Japan .................................. 9-255072

[51] Int. Cl.⁶ .......................... H01L 27/01; H01L 27/12; H01L 31/0392
[52] U.S. Cl. .......................... 257/347; 257/354; 257/386
[58] Field of Search ............................... 257/57, 66, 347, 257/354, 346

[56] References Cited

U.S. PATENT DOCUMENTS

| | | | |
|---|---|---|---|
| 5,206,533 | 4/1993 | Houston | 257/393 |
| 5,498,882 | 3/1996 | Houston | 257/57 |
| 5,637,899 | 6/1997 | Eimori et al. | 257/347 |
| 5,821,575 | 10/1998 | Mistry et al. | 257/281 |

FOREIGN PATENT DOCUMENTS 9-252130  9/1997  Japan .

*Primary Examiner*—Ngân V. Ngô
*Attorney, Agent, or Firm*—Oblon, Spivak, McClelland, Maier & Neustadt, P.C.

[57] ABSTRACT

An SOI-type MISFET with a body contact has a Si active layer arranged on an insulating layer. A pair of source and drain regions interposing a main channel region are arranged in the active layer. An additional channel region and a body-contact region are also arranged in the active layer. A gate electrode is arranged to have first and second portions facing the main and additional channel regions, respectively, through a gate insulating film. A main MIS capacitor and a parasitic MIS capacitor are formed under the first and second portions of the gate electrode, respectively. The additional channel region is doped with an impurity under a condition different from that of the main channel region such that electrical charges necessary for charging and discharging the parasitic MIS capacitor are decreased, in an operation voltage range of the device.

23 Claims, 10 Drawing Sheets

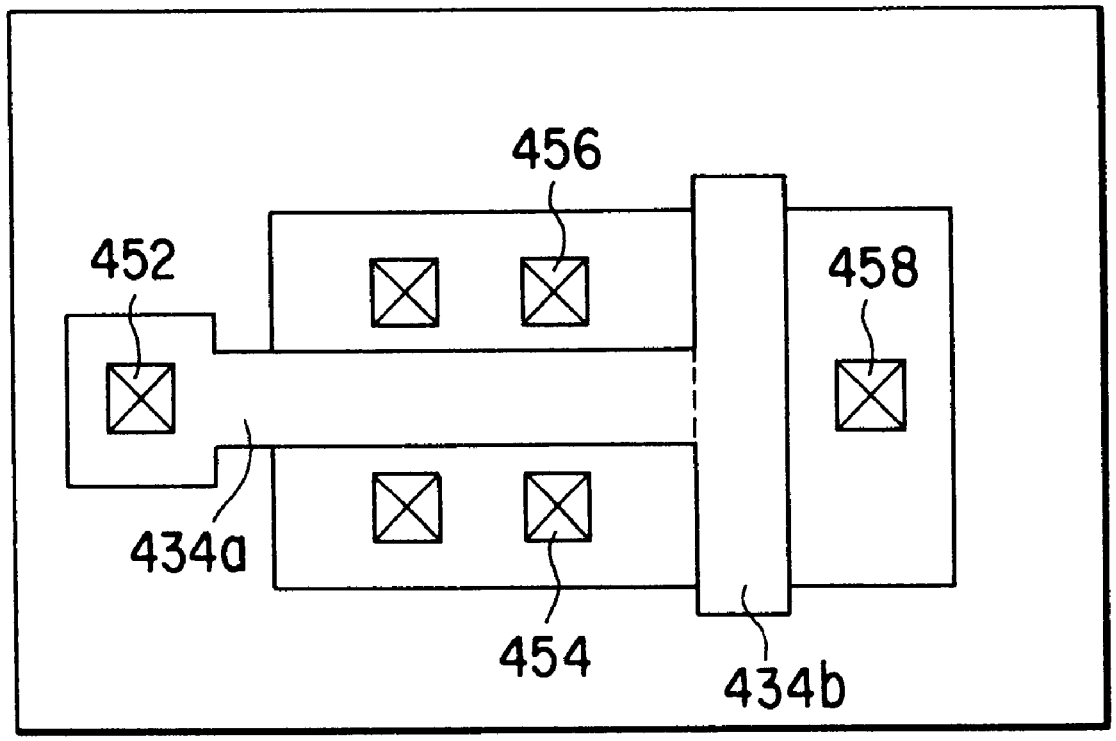
F I G. 12B

MIS SEMICONDUCTOR DEVICE HAVING BODY-CONTACT REGION

BACKGROUND OF THE INVENTION

The present invention relates to a semiconductor device, and more particularly to a semiconductor device employing an SOI (Silicon On Insulator) substrate.

With an increase in need for low electric power consumption and high operation speed on semiconductor integration circuits, it has been strongly demanded that respective semiconductor devices are miniaturized and their operation voltages are decreased. In light of this demand, SOI-type semiconductor devices attract attention, in place of conventional Bulk-type semiconductor devices. The SOI-type devices employ an SOI substrate having a semiconductor layer and an insulating layer stacked one on the other, while the Bulk-type devices employ a substrate entirely formed of a semiconductor layer. As compared with the Bulk-type devices, the SOI-type devices are considered to have several advantages, such as a smaller parasitic capacitance, a steeper sub-threshold characteristic, and a smaller substrate-bias effect.

An explanation will be given on a typical structure and manufacturing method of SOI-type devices, with reference to FIGS. 13A and 13B, which are plan and cross-sectional views showing an SOI-type MISFET.

As shown in FIGS. 13A and 13B, the SOI-type MISFET has a silicon (Si) support layer 12 and a single-crystal silicon (Si) active layer 16 stacked one on the other through an insulating film 14 of a silicon oxide film (SiO$_2$). A source region 24 and a drain region 26 are arranged in the active layer 16 to interpose a channel region 22. The source region 24 and the drain region 26 are formed by doping the active layer 16 with an impurity having a conductivity type opposite to that of the channel region 22 by means of, e.g., ion-implantation. A gate electrode 34 is disposed on the channel region 22 through a gate insulating film 32 of a silicon oxide film (SiO$_2$).

The insulating film 14 makes it difficult to control the electric potential of the body section in the SOI-type device, while the electric potential of a body section can be easily controlled in the Bulk-type devices. Consequently, the electric potential of the body section falls in a floating state during device operation in the SOI-type device, thereby bringing about problems, such that the device threshold voltage varies during the device operation, and the device breakdown voltage becomes lower. In light of these problems, various kinds of attempts have been made to control the electric potential of the body section of the SOI-type devices, as in the Bulk-type devices.

FIGS. 14A and 14B are plan and cross-sectional views showing a Bulk-type MISFET. FIGS. 15A and 15B are plan and cross-sectional views showing a thin-film SOI-type MISFET having a typical structure for controlling the body electric potential.

The Bulk-type MISFET shown in FIGS. 14A and 14B has a Si substrate 116, a gate insulating film 132, a gate electrode 134, a channel region 122, a source region 124, and a drain region 126. The gate electrode 134 is disposed on the Si substrate 116 through the thin gate insulating film 132. For example, in the Bulk-type MISFET, the Si substrate 116 is doped with an impurity to form a conductive layer having a low resistivity, by which the electric potential of the channel region 122a is controlled.

The thin-film SOI-type MISFET shown in FIGS. 15A and 15B has a Si support layer 212 and a Si active layer 216 stacked one on the other through an insulating film 214. A source region 224 and a drain region 226 are arranged in the active layer 216 to interpose a channel region 222. The source region 224 and the drain region 226 have a conductivity type opposite to that of the channel region 222. A gate electrode 234 is disposed on the channel region 222 through a gate insulating film 232.

In the thin-film SOI-type MISFET, the insulating film 214 is interposed between the Si support layer 212 and the Si active layer 216. For this reason, it is necessary to form a contact region (body-contact region) to efficiently control the body electric potential of each device.

The thin-film SOI-type MISFET shown in FIGS. 15A and 15B has a contact region 228 (body-contact region) having a conductivity type the same as that of the channel region 222. The gate electrode 234 has, e.g., a T-shape to form the contact region 228 and separate it from the source region 224 and the drain region 226. The body-contact region 228 is formed by doping the active layer 216 with an impurity at a high concentration to lower the resistivity of part of the active layer 216.

In the thin-film SOI-type MISFET shown in FIGS. 15A and 15B, in addition to the main channel region 222 formed under a portion 234a of the gate electrode 234, an additional channel region 223 is formed under a portion 234b of the gate electrode 234 to have a conductivity type the same as that of the main channel region 222. The additional channel region 223 brings about a parasitic MIS capacitor 240 as well as hardly contributing to the current drivability of the device. Where the parasitic capacitance of the device remarkably increases due to the parasitic MIS capacitor 240, problems arise in that the device comes to have a low operation speed and a large electric power consumption. Further, where the body-contact region having a low resistivity and the additional channel region 223 are located adjacent to each other, another problem arises in that junction leakage current increases.

BRIEF SUMMARY OF THE INVENTION

An object of the present invention is to decrease the ill effect of a parasitic MIS capacitor in a semiconductor device, e.g., having a structure as shown in FIGS. 15A and 15B, particularly in an SOI-type device, so that the device comes to have a high operation speed and a low electric power consumption.

According to the present invention there is provided a semiconductor device using a semiconductor active layer stacked on an insulating layer, comprising: a pair of first regions of a first conductivity type arranged in the active layer; a second region of a second conductivity type arranged in the active layer and interposed between the pair of first regions; a third region of the second conductivity type arranged in the active layer adjacent to the second region; and a gate electrode having first and second portions facing the second and third regions, respectively, through a gate insulating film, in which a main MIS capacitor and a parasitic MIS capacitor are formed under the first and second portions of the gate electrode, respectively.

According to a first aspect of the present invention, the second and third regions are arranged to have different impurity concentrations such that electrical charges necessary for charging and discharging the parasitic MIS capacitor are decreased, in an operation voltage range of the device. This arrangement may be achieved by doping the third region with an impurity under a condition different from that of the second region.

According to a second aspect of the present invention, the first and second portions of the gate electrode are arranged to have different work functions such that electrical charges necessary for charging and discharging the parasitic MIS capacitor are decreased, in an operation voltage range of the device.

According to a third aspect of the present invention, the device further comprises setting means for decreasing electrical charges necessary for charging and discharging the parasitic MIS capacitor, in an operation voltage range of the device. In this case, in the main MIS capacitor and the parasitic MIS capacitor, the gate insulating film has a substantially uniform thickness, and the second and third regions have substantially the same thickness as each other.

According to a fourth aspect of the present invention, there is provided a method of fabricating the device of the first aspect, comprising the steps of diffusing an impurity having a conductivity type the same as that of the second region into the active layer to form the third region, and then forming the gate electrode.

According to a fifth aspect of the present invention, there is provided a method of fabricating the device of the second aspect, comprising the steps of forming a semiconductor layer to be the gate electrode, and then diffusing impurities, under different conditions, into the semiconductor layer to correspond to the first and second portions of the gate electrode, respectively. Instead, the method may comprise the step of forming the first and second portions of the gate electrode, using different metal materials, respectively.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIGS. 2A, 2B, 3A, 3B, 4A, 4B and 5 are views showing steps of manufacturing the SOI-type MISFET according -to the first embodiment in the order, wherein FIG. 4A is a plan view and the other drawings are cross-sectional views;

FIGS. 9A, 9B, 10A, 10B, 11A, 11B and 12A are views showing steps of manufacturing the SOI-type MISFET according to the second embodiment in the order, wherein FIGS. 10A and 11A are plan views and the other drawings are cross-sectional views;

FIG. 12B is a plan view showing a modification according to the second embodiment;

DETAILED DESCRIPTION OF THE INVENTION

Figure 1A:
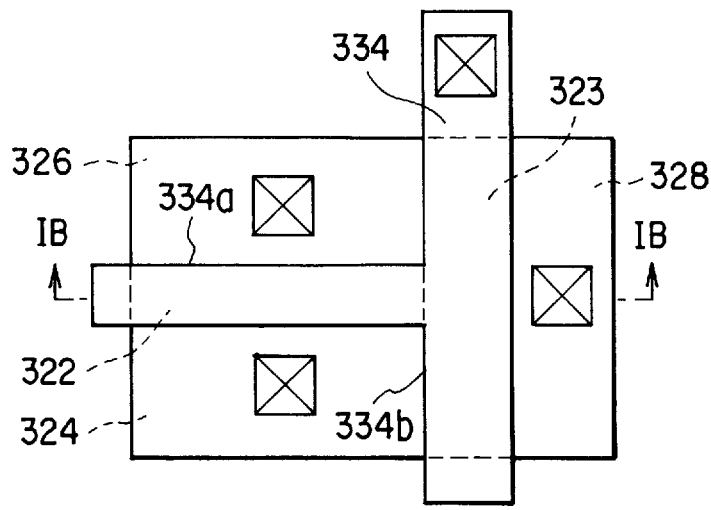
FIGS. 1A and 1B are plan and cross-sectional views showing an SOI-type MISFET with a body-contact according to a first embodiment of the present invention.
Figure 1B:
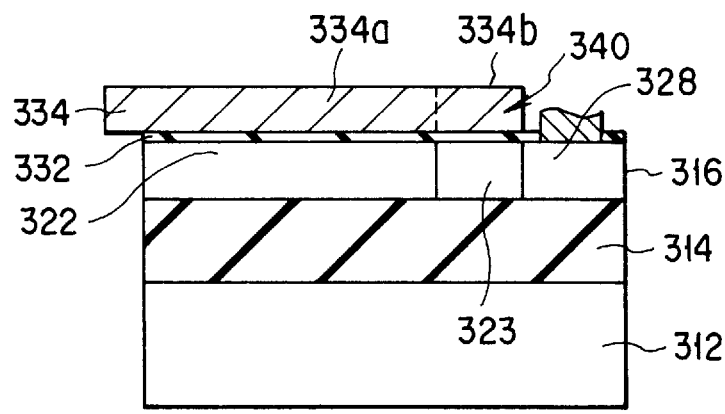

FIG. 1A is a plan view showing a thin-film SOI-type MISFET according to a first embodiment of the present invention. FIG. 1B is a cross-sectional view taken along the line IB—IB in FIG. 1A.

As shown in FIGS. 1A and 1B, this thin-film SOI-type MISFET has a Si support layer 312 and a Si active layer 316 stacked one on the other through an insulating film 314. A source region 324 and a drain region 326 are arranged in the active layer 316 to interpose a channel region 322. The source region 324 and the drain region 326 have a conductivity type opposite to that of the channel region 322. A gate electrode 334 is disposed on the channel region 322 through a gate insulating film 332.

A contact region 328 (body-contact region) is also arranged in the active layer 316 to have a conductivity type the same as that of the channel region 322. The gate electrode 334 has a T-shape to form the contact region 328 and separate it from the source region 324 and the drain region 326. The body-contact region 328 is formed by doping the active layer 316 with an impurity at a high concentration to lower the resistivity of part of the active layer 316.

In the active layer, in addition to the main channel region 322 formed under a portion 334a of the gate electrode 334, an additional channel region 323 is formed under a portion 334b of the gate electrode 334 to have a conductivity type the same as that of the main channel region 322. The additional channel region 323 brings about a parasitic MIS capacitor 340 as well as hardly contributing to the current drivability of the device.

In the first embodiment, the additional channel region 323 corresponding to the parasitic MIS capacitor 340 is doped with an impurity, so that electrical charges necessary for charging and discharging the parasitic MIS capacitor 340 are decreased, in the operation voltage range of the MISFET. In other words, the inversion threshold voltage of the parasitic MIS capacitor 340 is shifted to differ from the inversion threshold voltage of the main MIS capacitor corresponding to the main channel region 322. For this purpose, no change is performed on the thickness of the gate insulating film and the active layer. Namely, in the main and parasitic MIS capacitors, the gate insulating film has a substantially uniform thickness, and the channel regions 322 and 323 have substantially the same thickness.

Figure 3A:
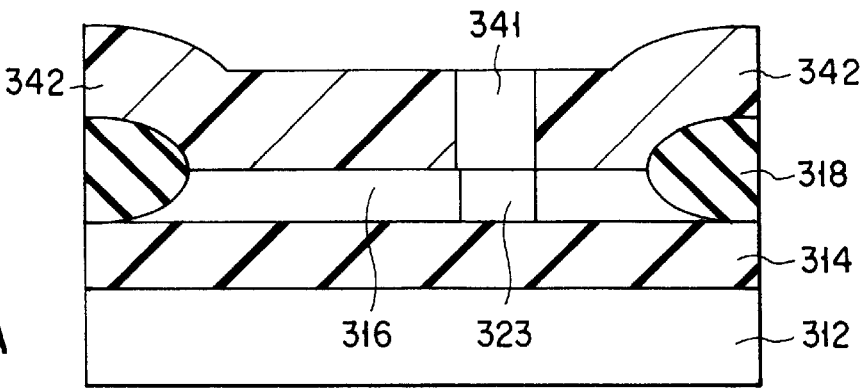
Figure 3B:
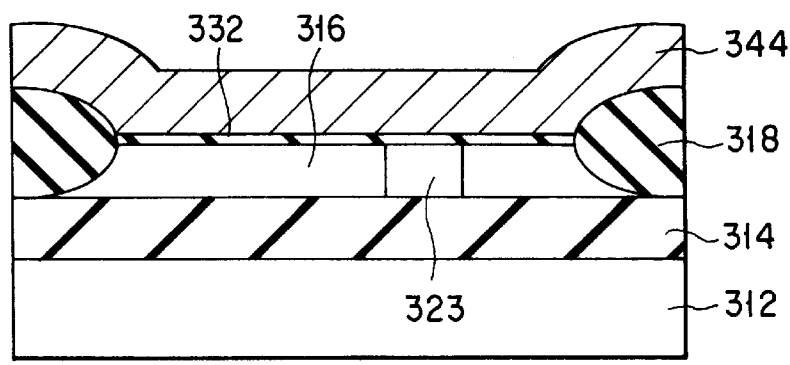
Figure 4A:
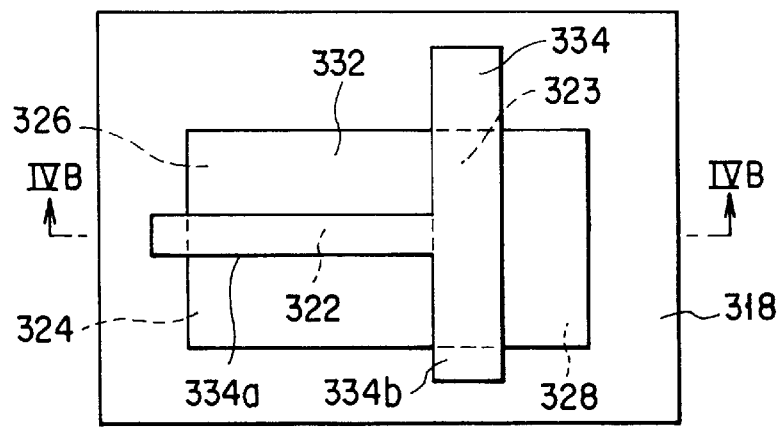

FIGS. 2A to 5 are views showing steps of manufacturing the SOI-type MISFET according to the first embodiment in the order, wherein FIG. 4A is a plan view and the other drawings are cross-sectional views.

Step A1

Figure 2A:
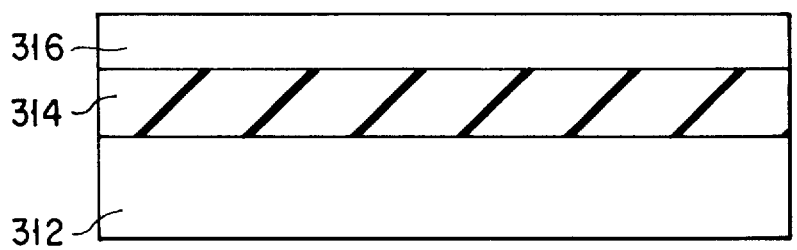

As shown in FIG. 2A, the insulating film 314 of, e.g., a Si oxide film, and the Si active layer 316 are stacked on the Si support layer 312 in that order by means of, e.g., SIMOX (Separation by Implantation of Oxygen), bonding or the like. Then, the active layer 316 is made thinner to a predetermined thickness of, e.g., 150 nm, by means of, e.g., thermal oxidation and etching with $NH_4F$.

Step A2

Figure 2B:
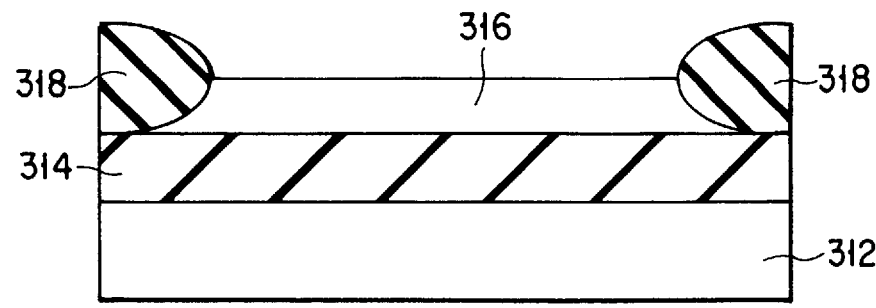

As shown in FIG. 2B, the active layer 316 is oxidized by means of, e.g., LOCOS (Local Oxidation of Silicon) using a mask, to form a device isolation section 318 for electrically isolating the respective devices from each other. Then, the mask is removed, and a device formation section (which will be indicated with reference number 316) isolated by the isolation section 318 is arranged in the active layer 316. Then, the formation section 316 is doped with an impurity by means of, e.g., ion-implantation to adjust the threshold voltage of the main channel region 322.

Step A3

As shown in FIG. 3A, a resist pattern 342 is formed to have an opening 341 corresponding to the additional channel region 323, which provides the parasitic MIS capacitor 340. Then, a portion to be the additional channel region 323 is doped with a predetermined impurity by means of, e.g., ion-implantation, using the resist pattern 342 as a mask. The ion-implantation performed here is set such that the parasitic MIS capacitor 340 has an inversion threshold voltage higher than that of the main channel region 322 through which electric current mainly flows. After the ion-implantation, the resist pattern 342 is removed.

Step A4

As shown in FIG. 3B, the gate insulating film 332 is formed on the formation section 316 by means of thermal oxidation. Then, a conductive film 344 for forming the gate electrode 334 is formed on the gate insulating film 332. The conductive film 344 is formed by depositing, e.g., polycrystalline Si to a predetermined thickness by means of CVD (Chemical Vapor Deposition), and then doping it with an impurity by means of, e.g., vapor phase diffusion.

Step A5

Figure 4B:
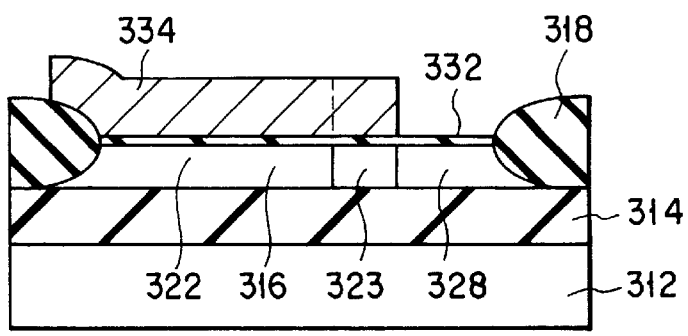

The conductive film 344 is pattern-etched by means of, e.g., RIE (Reactive Ion Etching), using a resist pattern as a mask. As a result, as shown in FIGS. 4A and 4B, the gate electrode 334 having a T-shape is formed, and portions corresponding to the source, drain, and body-contact regions 324, 326, and 328 are exposed.

The portions corresponding to the source and drain regions 324 and 326 are doped with an impurity to form diffusion layers having a conductivity type opposite to that of the main channel region 322, by means of, e.g., ion-implantation, using a resist pattern or the like as a mask. The portion corresponding to the body-contact region 328 is doped with an impurity to form a diffusion layer having a conductivity type the same as that of the main channel region 322, by means of, e.g., ion-implantation, using a resist pattern or the like as a mask. Then, the resultant structure is annealed by means of, e.g., RTA (Rapid Thermal Annealing) at 1000° C. for 30 seconds to activate the impurities introduced by the ion-implantation.

Step A6

Figure 5:
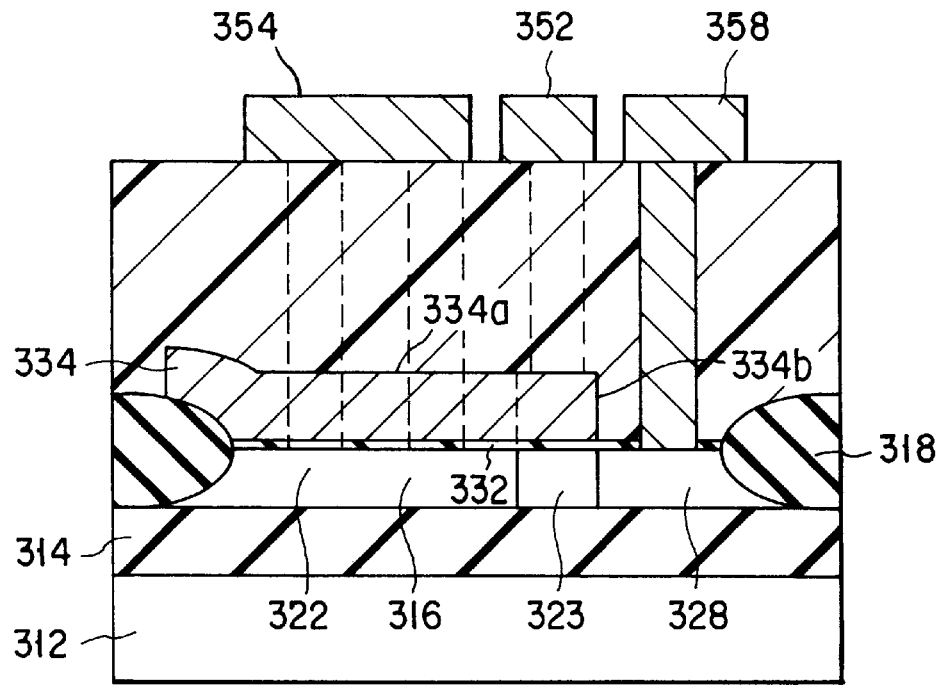

An interlevel insulating film is deposited on the resultant structure and contact holes are formed in the insulating film. Then, wiring or connecting electrodes, such as a gate wiring 352, a source wiring 354, a drain wiring (not shown), and a body-contact wiring 358, are formed. As a result, a structure as shown in FIG. 5 is completed.

Figure 6:
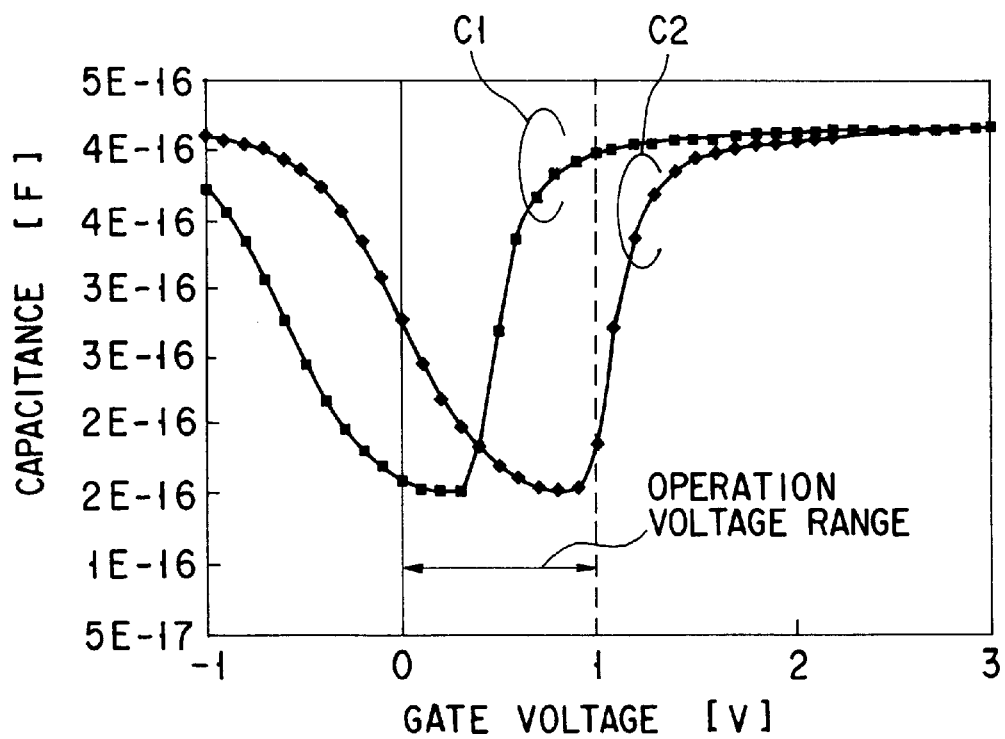
FIG. 6 is a graph showing the gate electrode voltages vs capacitance characteristics of a main MIS capacitor and a parasitic MIS capacitor in the SOI-type MISFET according to the first embodiment.

FIG. 6 is a graph showing the gate electrode voltages vs capacitance characteristic C1 of the main MIS capacitor corresponding to the main channel region 322, and the gate electrode voltages vs capacitance characteristic C2 of the parasitic MIS capacitor corresponding to the additional channel region 323, in the SOI-type MISFET formed by the above described method. As shown in FIG. 6, the capacitance of the parasitic MIS capacitor 340 is decreased to the lowest level or smallest, in the operation voltage range of the MISFET, which is from 0V to 1V.

Accordingly, in the above described method, the additional channel region 323 corresponding to the parasitic MIS capacitor 340 is doped with an impurity, so that the inversion threshold voltage of the parasitic MIS capacitor 340 is shifted, and electrical charges necessary for charging and discharging the parasitic MIS capacitor 340 are decreased, in the operation voltage range of the MISFET. With this arrangement, as shown in FIG. 6, the parasitic capacitance due to the parasitic MIS capacitor is decreased to the lowest level, in the operation voltage range of the MISFET, thereby increasing the operation speed of the MISFET.

Further, in this method, since the impurity concentration of the additional channel region 323 is increased, the parasitic resistance in the region is decreased. Consequently, the electric potential of the main channel region 322 can be effectively controlled through the body-contact.

Furthermore, where the operation voltage of the MISFET is low, no accumulation layer or inversion layer is formed in the parasitic MIS capacitor. Consequently, a depletion layer having a width almost the same as the parasitic MIS capacitor is expanded at the p-n junction between the source region, drain region, and channel inversion layer, and the body-contact region. As a result, this structure has little leakage current, such as avalanche current or tunnel current, as in a case where a high concentration p-n junction is formed.

Figure 7A:
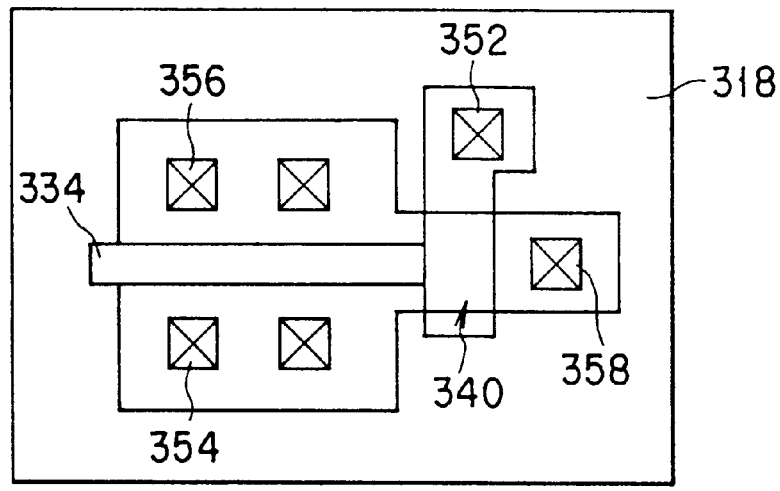
FIGS. 7A to 7C are plan views showing modifications according to the first embodiment.
Figure 7B:
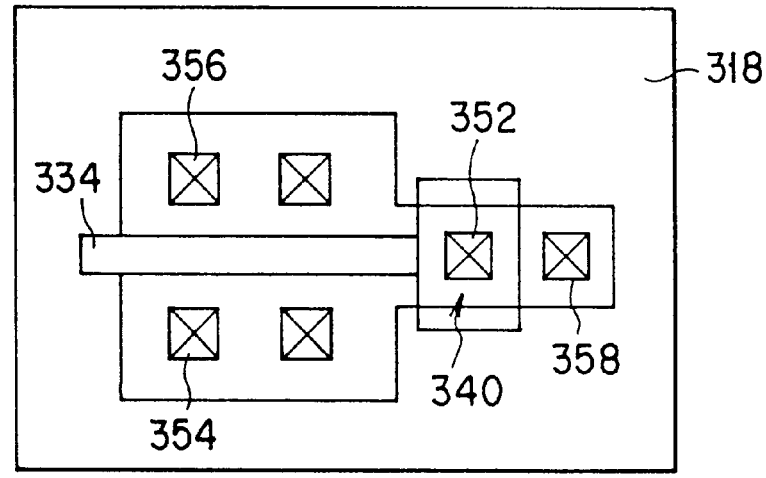
Figure 7C:
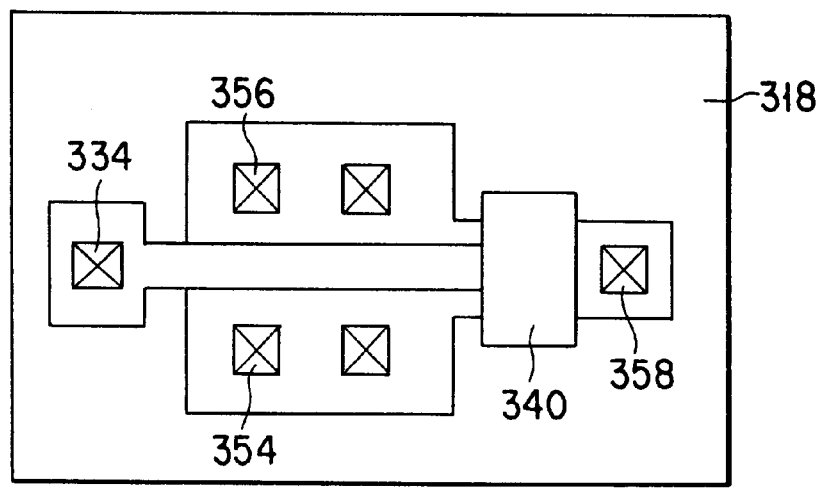

Note that the first embodiment is not limited to the structure shown in the plan view of FIG. 4A, but may be modified in accordance with a layout for forming a contact with the body region of an SOI-type device, as shown in FIGS. 7A, 7B, and 7C.

Figure 8A:
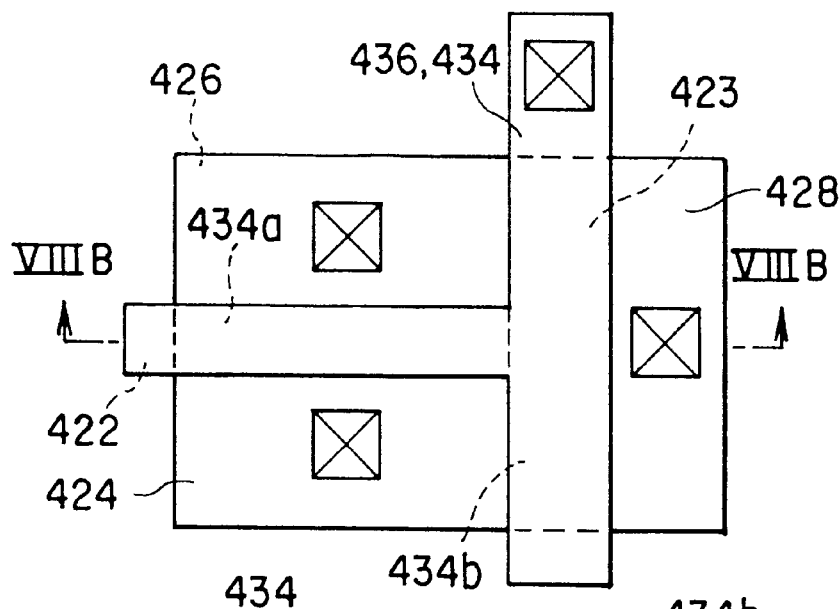
FIGS. 8A and 8B are plan and cross-sectional views showing an SOI-type MISFET with a body-contact according to a second embodiment of the present invention.
Figure 8B:
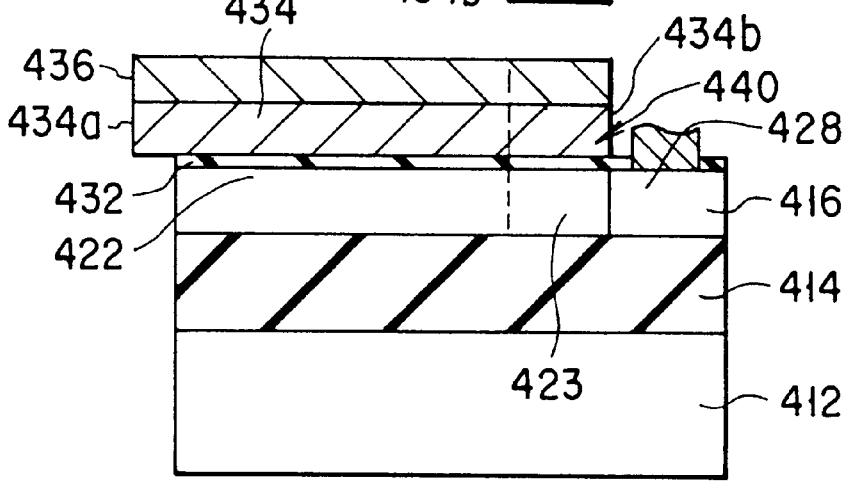

FIG. 8A is a plan view showing a thin-film SOI-type MISFET according to a second embodiment of the present invention. FIG. 8B is a cross-sectional view taken along the line VIIIB—VIIIB in FIG. 8A.

As shown in FIGS. 8A and 8B, this thin-film SOI-type MISFET has a Si support layer 412 and a Si active layer 416 stacked one on the other through an insulating film 414. A source region 424 and a drain region 426 are arranged in the active layer 416 to interpose a channel region 422. The source region 424 and the drain region 426 have a conductivity type opposite to that of the channel region 422. A gate electrode 434 is disposed on the channel region 422 through a gate insulating film 432.

A contact region 428 (body-contact region) is also arranged in the active layer 416 to have a conductivity type the same as that of the channel region 422. The gate electrode 434 has a T-shape to form the contact region 428 and separate it from the source region 424 and the drain region 426. The body-contact region 428 is formed by doping the active layer 416 with an impurity at a high concentration to lower the resistivity of part of the active layer 416.

In the active layer, in addition to the main channel region 422 formed under a portion 434*a* of the gate electrode 434, an additional channel region 423 is formed under a portion 434*b* of the gate electrode 434 to have a conductivity type the same as that of the main channel region 422. The additional channel region 423 brings about a parasitic MIS capacitor 440 as well as hardly contributing to the current drivability of the device.

In the second embodiment, the work function of the portion 434b of the gate electrode 434 corresponding to the parasitic MIS capacitor 440 is changed, so that electrical charges necessary for charging and discharging the parasitic MIS capacitor 440 are decreased, in the operation voltage range of the MISFET. In other words, the inversion threshold voltage of the parasitic MIS capacitor 440 is shifted to differ from the inversion threshold voltage of the main MIS capacitor corresponding to the main channel region 422. For this purpose, no change is performed on the thickness of the gate insulating film and the active layer. Namely, in the main and parasitic MIS capacitors, the gate insulating film has a substantially uniform thickness, and the channel regions 422 and 423 have substantially the same thickness. A conductive layer 436 is arranged on the gate electrode 434 to electrically connect the portions 434a and 434b of the gate electrode 434, and to reduce the lateral resistance of the gate electrode 434.

Figure 9A:
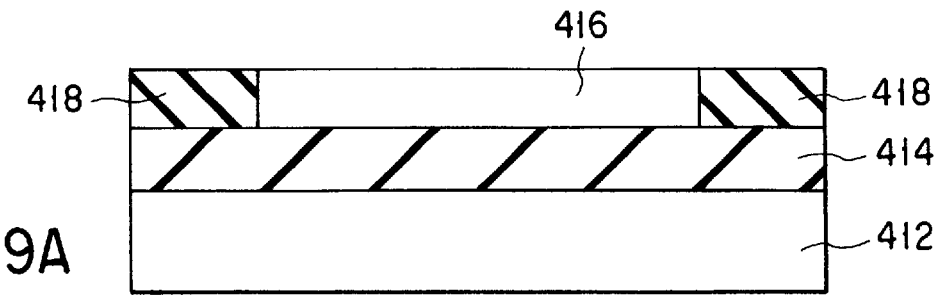
Figure 9B:
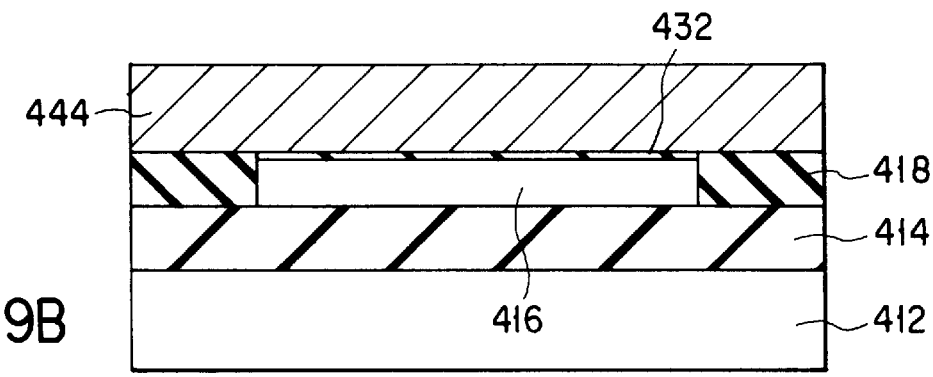
Figure 10A:
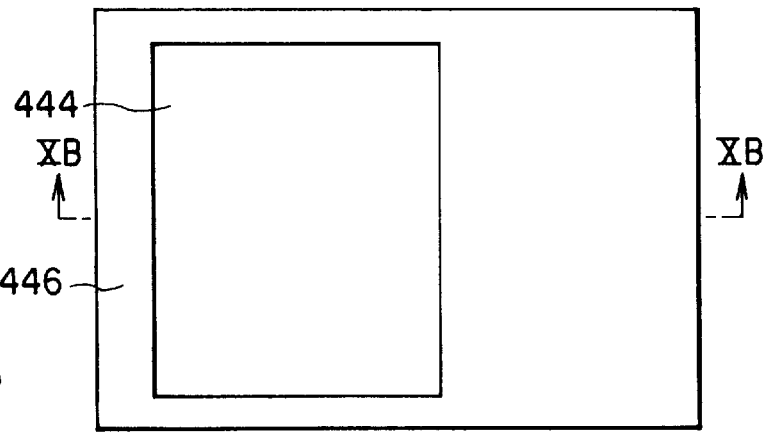
Figure 10B:
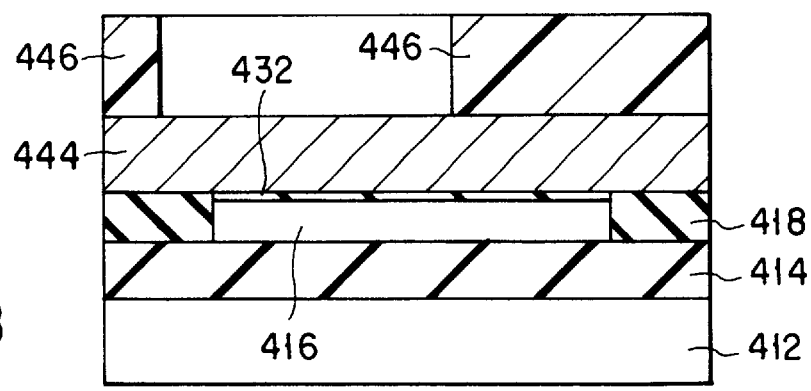
Figure 11A:
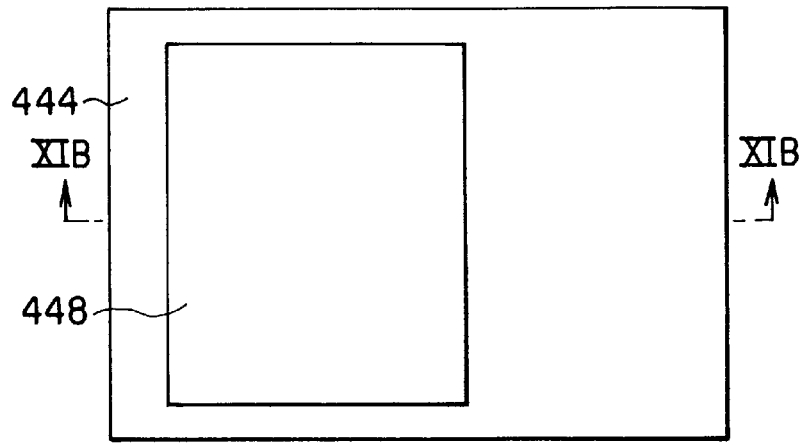

FIGS. 9A to 12A are views showing steps of manufacturing the SOI-type MISFET according to the second embodiment in the order, wherein FIGS. 10A and 11A are plan views and the other drawings are cross-sectional views.

Step B1

As shown in FIG. 9A, the insulating film 414 of, e.g., a Si oxide film, and the Si active layer 416 are stacked on the Si support layer 412 in that order. Then, the active layer 416 is made thinner to a predetermined thickness. Then, a device isolation section 418 for electrically isolating the respective devices from each other is formed by means of, e.g., STI (Shallow Trench Isolation). As a result, a device formation section (which will be indicated with reference number 416) isolated by the isolation section 418 is arranged in the active layer 416. Then, the formation section 416 is doped with an impurity by means of, e.g., ion-implantation to adjust the threshold voltage of the main channel region 422.

Step B2

As shown in FIG. 9B, the gate insulating film 432 is formed on the formation section 416 by means of thermal oxidation. Then, a Si film 444 for forming the gate electrode 434 is formed on the gate insulating film 432. The Si film 444 is formed by depositing, e.g., polycrystalline Si to a predetermined thickness by means of CVD (Chemical Vapor Deposition).

Step B3

The Si film 444 is doped with impurities by means of, e.g., ion-implantation to form the gate electrode 434 as follows: First, as shown in FIGS. 10A and 10B, a mask 446 made of, e.g., a resist pattern, is formed on the Si film 444 such that a portion corresponding to the MISFET is exposed while a portion corresponding to the parasitic MIS capacitor 440 is covered. The portion of the Si film 444 corresponding to the MISFET is sequentially doped with a first impurity by means of ion-implantation, using the mask 446.

Step B4

Figure 11B:
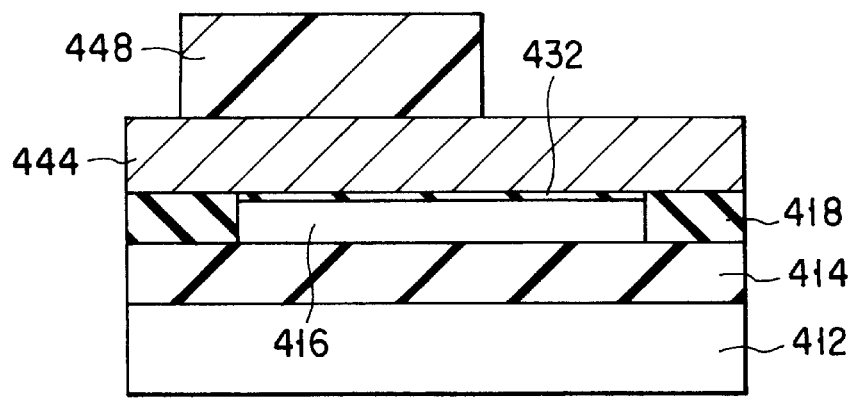

After the mask 446 is removed, as shown in FIGS. 11A and 11B, a mask 448 made of, e.g., a resist pattern, is formed on the Si film 444 such that the portion corresponding to the MISFET is covered while the portion corresponding to the parasitic MIS capacitor 440 is exposed. The portion of the Si film 444 corresponding to the parasitic MIS capacitor 440 is sequentially doped with a second impurity by means of ion-implantation, using the mask 448. These ion-implantation steps are conducted for the portions ion-implanted with the first and second impurities to have conductive types opposite to each other. For example, where the device is n-type, As (arsenic) is used as the first impurity to cause the portion of the Si film 444 corresponding to the MISFET to be n-type, while B (boron) is used as the second impurity to cause the portion of the Si film 444 corresponding to the parasitic MIS capacitor to be p-type.

With these ion-implantation steps, the work function of the gate electrode 434 is set to differ between the portion corresponding to the MISFET, in which the portion 434a will be left to last, and the portion corresponding to the parasitic MIS capacitor, in which the portion 434b will be left to last. As a result, -the inversion threshold voltage of the parasitic MIS capacitor 440 is shifted and electrical charges necessary for charging and discharging the parasitic MIS capacitor 440 are decreased, in the operation voltage range of the MISFET.

Step B5

A conductive film to be used as the conductive layer 436 is formed on the conductive film 444 for forming the gate electrode 434, by depositing, e.g., WSi$_2$ (tungsten silicide) by means of sputtering. Then, the conductive film 444 and the WSi$_2$ film are pattern-etched by means of, e.g., RIE (Reactive Ion Etching), using a resist pattern as a mask. As a result, the gate electrode 434 and the conductive layer 436 each having a T-shape are formed, and portions corresponding to the source, drain, and body-contact regions 424, 426, and 428 are exposed. The conductive layer 436 electrically connects the portions 434a and 434b of the gate electrode 434, which are of different conductivity types from each other, and reduces the lateral resistance of the gate electrode 434.

Step B6

The portions corresponding to the source and drain regions 424 and 426 are doped with an impurity to form diffusion layers having a conductivity type opposite to that of the active layer 416, by means of, e.g., ion-implantation, using a resist pattern or the like as a mask. The portion corresponding to the body-contact region 428 is doped with an impurity to form a diffusion layer having a conductivity type the same as that of the active layer 416, by means of, e.g., ion-implantation, using a resist pattern or the like as a mask. Then, the resultant structure is annealed by means of, e.g., RTA (rapid Thermal Annealing) at 1000° C. for 40 seconds to activate the impurities introduced by the ion-implantation.

Step B7

Figure 12A:
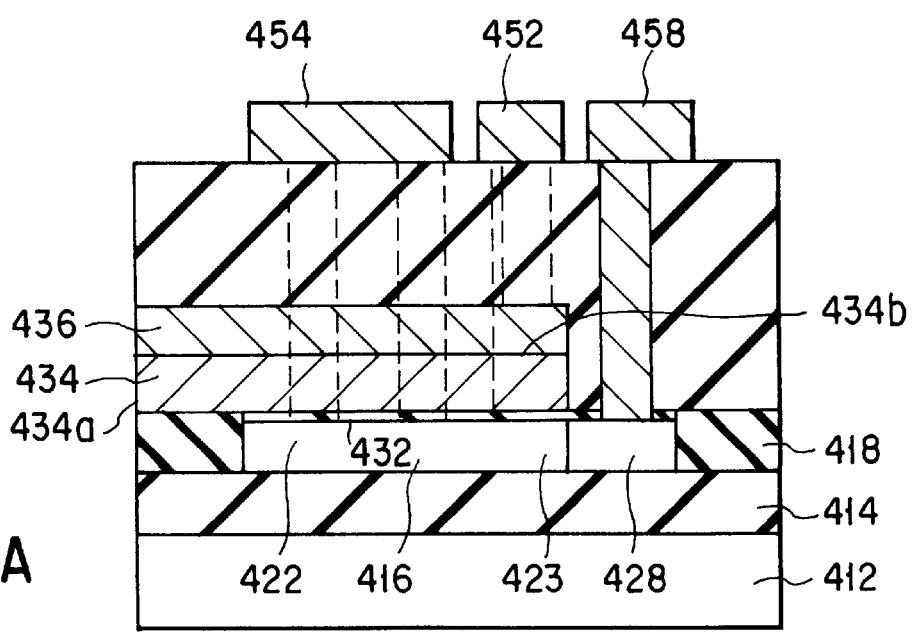
Figure 13A:
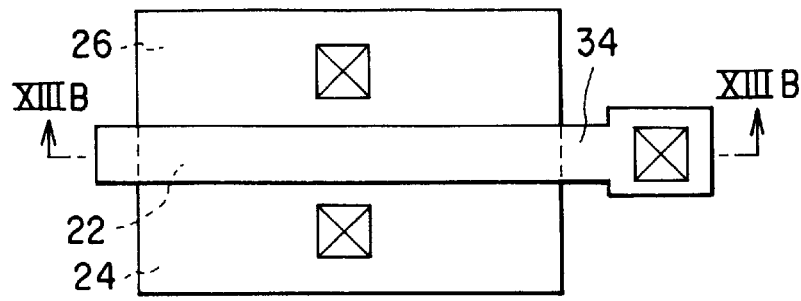
FIGS. 13A and 13B are plan and cross-sectional views showing an SOI-type MISFET.
Figure 13B:
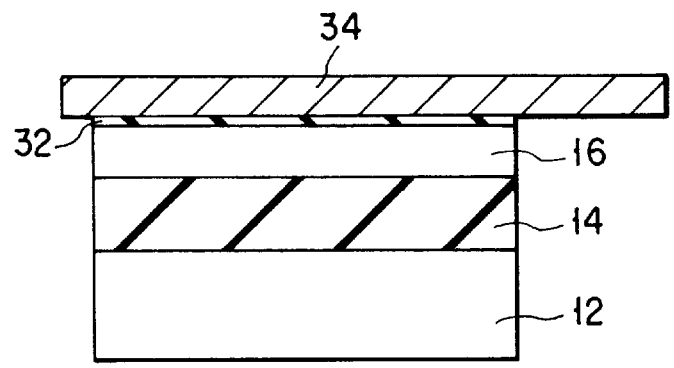
Figure 14A:
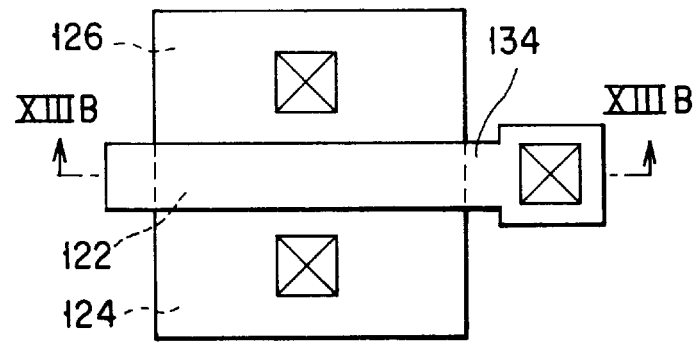
FIGS. 14A and 14B are plan and cross-sectional views showing a Bulk-type MISFET.
Figure 14B:
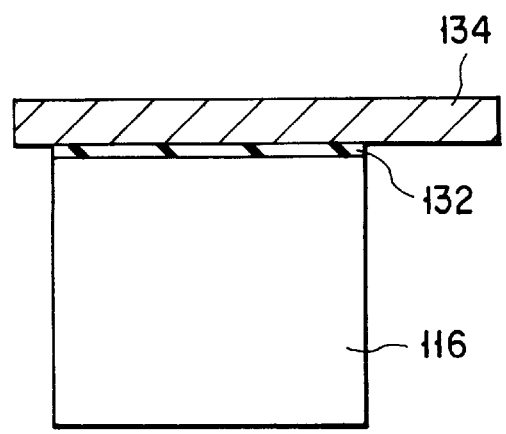
Figure 15A:
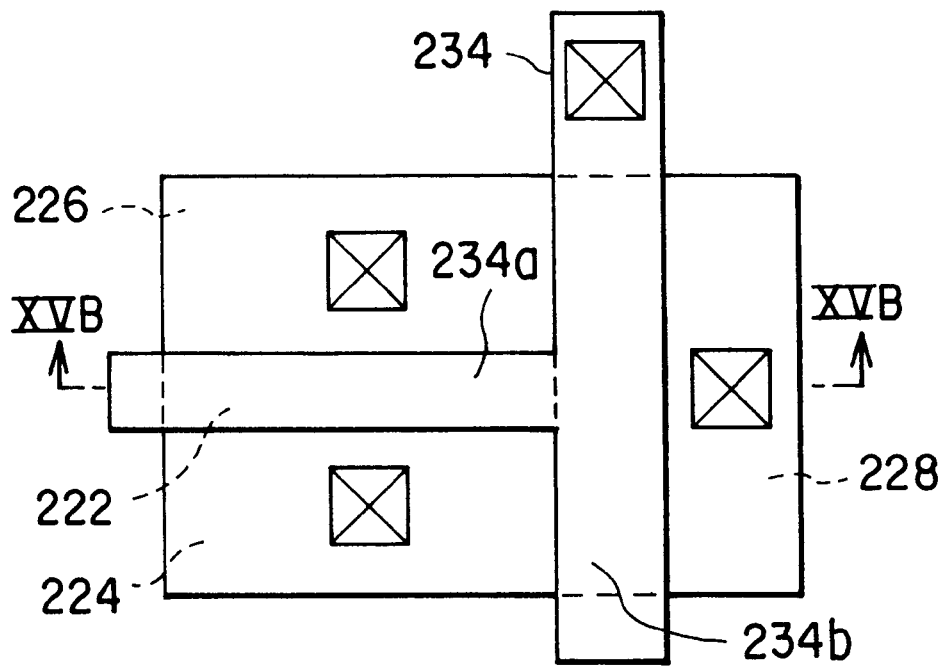
FIGS. 15A and 15B are plan and cross-sectional views showing an SOI-type MISFET with a body-contact.
Figure 15B:
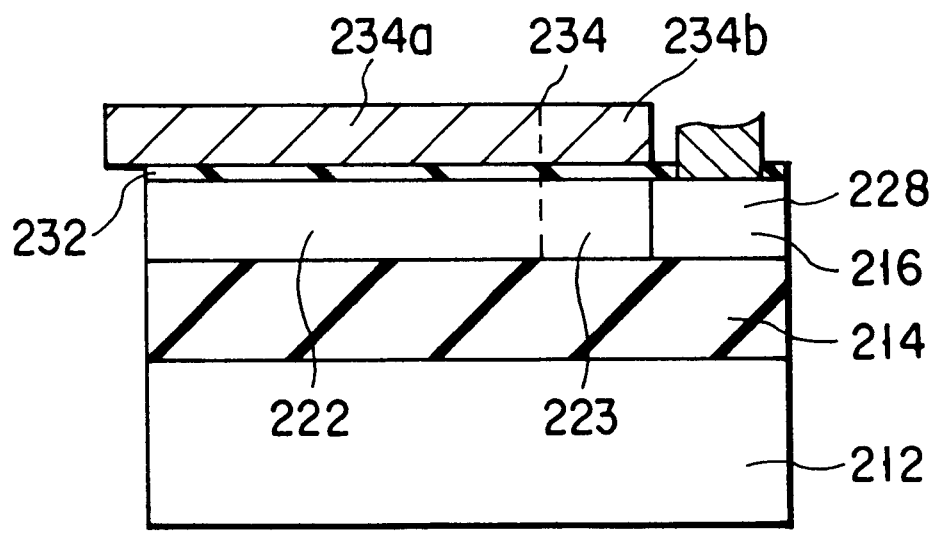

An interlevel insulating film is deposited on the resultant structure and contact holes are formed in the insulating film. Then, wiring or connecting electrodes, such as a gate wiring 452, a source wiring 454, a drain wiring 456, and a body-contact wiring 458, are formed. As a result, a structure as shown in FIG. 12A is completed.

Accordingly, in the above described method, the work function of the portion 434b of the gate electrode 434 corresponding to the parasitic MIS capacitor 440 is changed, so that the inversion threshold voltage of the parasitic MIS capacitor 440 is shifted, and electrical charges necessary for charging and discharging the parasitic MIS capacitor 440 are decreased, in the operation voltage range of the MISFET. With this arrangement, as in the first embodiment, the parasitic capacitance due to the parasitic MIS capacitor is decreased, in the operation voltage range of the MISFET, thereby increasing the operation speed of the MISFET.

Further, as in the first embodiment, where the operation voltage of the MISFET is low, no accumulation layer or inversion layer is formed in the parasitic MIS capacitor. As a result, this structure has little leakage current at the p-n junction between the source region, drain region, and channel inversion layer, and the body-contact region.

Note that, in the above described embodiment, the polycrystalline Si film to be the gate electrode 434 is doped with impurities having different conductivity types by means of ion-implantation to control the work function of the gate electrode 434. However, control of the work function is not limited to this method, but may be performed by means of any one of various methods. For example, the portions of the gate electrode corresponding to the MISFET and the parasitic MIS capacitor may be formed of metal materials having different work functions, respectively.

In the above described embodiment, the portion 434b of the gate electrode 434 corresponding to the parasitic MIS capacitor 440 is doped with an impurity having a conductivity type opposite to that of the portion 434a of the gate electrode 434, thereby forming a p-n junction in the gate electrode 434. Then, the conductive layer 436 is arranged to electrically connect the portions 434a and 434b corresponding to the two capacitors. Instead of arranging the conductive layer 436, a gate wiring 452 may be arranged for the portion 434b of the gate electrode 434 corresponding to the parasitic MIS capacitor 440, as shown in FIG. 12B. With this arrangement, the portion 434b of the gate electrode 434 is in a floating state, thereby decreasing the capacitance of the parasitic MIS capacitor 440, as the present invention aims at.

Further, in the second embodiment, the shapes of masks used for doping the gate electrode with impurities are not limited to the ones shown in the plan views of FIGS. 10A and 11A, but may be modified in accordance with the layout of a device.

The first and second embodiments are not limited by device insulation methods, but may be performed by means of any one of LOCOS, STI, Mesa Insulation, and the like. Further, in place of an SOI substrate formed by means of SIMOX as in the embodiments, another type of substrate, such as a substrate formed by means of various bonding methods, a substrate having a single-crystalline Si grown on an insulating film, and a SOS (Silicon on Sapphire) substrate, may be used.

According to the present invention, the inversion threshold voltage of a parasitic MIS capacitor in, e.g., a thin-film SOI-type device having a body-contact region, can be controlled without causing the manufacturing process of the device to be complicated or increasing the occupation space of the device. As a result, the parasitic capacitance due to the parasitic MIS capacitor can be decreased, and, further, leakage current between the source and drain regions, and the body-contact region can be decreased.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

I claim:

1. A MIS semiconductor device using a semiconductor active layer stacked on an insulating layer, comprising:
    a pair of first regions of a first conductivity type arranged in said active layer;
    a second region of a second conductivity type arranged in said active layer and interposed between said pair of first regions;
    a third region of the second conductivity type arranged in said active layer adjacent to said second region; and
    a gate electrode having first and second portions facing said second and third regions, respectively, through a gate insulating film, in which a main MIS capacitor and a parasitic MIS capacitor are formed under said first and second portions of said gate electrode, respectively, wherein said second and third regions are arranged to have different impurity concentrations.

2. The device according to claim 1, wherein said third region is doped with an impurity under a condition different from that of the second region.

3. The device according to claim 2, wherein said condition for doping said third region with said impurity is arranged such that capacitance of said parasitic MIS capacitor becomes substantially smallest, in the operation voltage range of said device.

4. The device according to claim 3, further comprising a contact region having a resistivity lower than that of said second region and arranged in said active layer, to be connected to a wiring for applying an electric potential to said second region.

5. The device according to claim 4, wherein said condition for doping said third region with said impurity is arranged such that leakage current flowing between said first region and said contact region is reduced, in the operation voltage range of said device.

6. The device according to claim 5, wherein said main MIS capacitor is part of a MISFET in which said first regions are source and drain regions, and said second region is a channel region.

7. The device according to claim 1, further comprising a semiconductor support layer arranged to face said active layer through said insulating layer.

8. A MIS semiconductor device using a semiconductor active layer stacked on an insulating layer, comprising:
    a pair of first regions of a first conductivity type arranged in said active layer;
    a second region of a second conductivity type arranged in said active layer and interposed between said pair of first regions;
    a third region of the second conductivity type arranged in said active layer adjacent to said second region; and
    a gate electrode having first and second portions facing said second and third regions, respectively, through a gate insulating film, in which a main MIS capacitor and a parasitic MIS capacitor are formed under said first and second portions of said gate electrode, respectively, wherein said first and second portions of said gate electrode are arranged to have different work functions.

9. The device according to claim 8, wherein said work function of said second portion of said gate electrode is arranged such that capacitance of said parasitic MIS capacitor becomes substantially smallest, in the operation voltage range of said device.

10. The device according to claim 9, further comprising a contact region having a resistivity lower than that of said second region and arranged in said active layer, to be connected to a wiring for applying an electric potential to said second region.

11. The device according to claim 10, wherein said work function of said second portion of said gate electrode is arranged such that leakage current flowing between said first region and said contact region is reduced, in the operation voltage range of said device.

12. The device according to claim 11, wherein said first and second portions of said gate electrode comprise semiconductor layers having different conductivity types from each other, and a conductive layer is disposed on said gate electrode to electrically connect said first and second portions.

13. The device according to claim 11, wherein said first and second portions of said gate electrode consist essentially of metal materials having work functions different from each other.

14. The device according to claim 11, wherein said main MIS capacitor is part of a MISFET in which said first regions are source and drain regions, and said second region is a channel region.

15. The device according to claim 8, further comprising a semiconductor support layer arranged to face said active layer through said insulating layer.

16. A MIS semiconductor device using a semiconductor active layer stacked on an insulating layer, comprising:
a pair of first regions of a first conductivity type arranged in said active layer;
a second region of a second conductivity type arranged in said active layer and interposed between said pair of first regions;
a third region of the second conductivity type arranged in said active layer adjacent to said second region;
a gate electrode having first and second portions facing said second and third regions, respectively, through a gate insulating film, in which a main MIS capacitor and a parasitic MIS capacitor are formed under said first and second portions of said gate electrode, respectively; and
setting means for decreasing electrical charges necessary for charging and discharging said parasitic MIS capacitor, in an operation voltage range of said device, wherein, in said main MIS capacitor and said parasitic MIS capacitor, said gate insulating film has a substantially uniform thickness, and said second and third regions have substantially the same thickness as each other.

17. The device according to claim 16, wherein it is set by said setting means such that capacitance of said parasitic MIS capacitor becomes substantially smallest, in the operation voltage range of said device.

18. The device according to claim 17, further comprising a contact region having a resistivity lower than that of said second region and arranged in said active layer, to be connected to a wiring for applying an electric potential to said second region.

19. The device according to claim 18, wherein it is set by said setting means such that leakage current flowing between said first region and said contact region is reduced, in the operation voltage range of said device.

20. The device according to claim 19, wherein said main MIS capacitor is part of a MISFET in which said first regions are source and drain regions, and said second region is a channel region.

21. The apparatus according to claim 1, wherein said second and third regions have different impurity concentrations such that electrical charges necessary for charging and discharging said parasitic MIS capacitor are decreased, in an operation voltage range of said device.

22. The apparatus according to claim 8, wherein said first and second portions of said gate electrode are arranged to have different work functions such that electrical charges necessary for charging and discharging said parasitic MIS capacitor are decreased, in an operation voltage range of said device.

23. The apparatus according to claim 1, wherein said third region has an impurity concentration higher than that of said second region.

* * * * *